United States Patent
Leung et al.

(10) Patent No.: US 6,448,917 B1
(45) Date of Patent: Sep. 10, 2002

(54) DAC USING CURRENT SOURCE DRIVING MAIN RESISTOR STRING

(75) Inventors: Ka Y. Leung, Austin; Douglas R. Holberg, Wimberley, both of TX (US)

(73) Assignee: Cygnal Integrated Products, Inc., Austin, TX (US)

( * ) Notice: Subject to any disclaimer, the term of this patent is extended or adjusted under 35 U.S.C. 154(b) by 0 days.

(21) Appl. No.: 09/668,882

(22) Filed: Sep. 25, 2000

Related U.S. Application Data (63) Continuation-in-part of application No. 09/584,217, filed on May 31, 2000.

(51) Int. Cl.[7] ................................................. H03M 1/66
(52) U.S. Cl. ....................................... 341/144; 341/154
(58) Field of Search ................................. 341/143, 144, 341/154

(56) References Cited

U.S. PATENT DOCUMENTS

| | | | |
|---|---|---|---|
| 4,338,591 A | 7/1982 | Tuthill | 340/347 |
| 5,220,483 A | 6/1993 | Scott | 361/313 |
| 5,343,199 A | 8/1994 | Sugawa | 341/159 |
| 5,581,252 A | 12/1996 | Thomas | 341/144 |
| 5,619,203 A | 4/1997 | Gross, Jr. et al. | 341/144 |
| 5,703,588 A | 12/1997 | Rivoir et al. | 341/159 |
| 5,731,775 A | 3/1998 | Gross, Jr. et al. | 341/155 |
| 5,760,729 A * | 6/1998 | Rumreich | 341/159 |
| 5,969,657 A * | 10/1999 | Dempsey et al. | 341/145 |
| 6,157,335 A | 12/2000 | Suzuki et al. | 341/154 |
| 6,166,672 A * | 12/2000 | Park | 341/145 |
| 6,191,720 B1 * | 2/2001 | Zhang | 341/145 |

OTHER PUBLICATIONS

A Monolithic Charge–Balancing Successive Approximation A/D Technique, Thomas P. Redfern, Joseph J. Connolly, Jr., Sing W. Chin and Thomas M. Frederiksen, *IEEE J. Solid State Circuits*, vol. SC–14, pp. 912–920, Dec. 1979.

"High Resolutin A/D Conversion in MOS/LSI"; Bahram Fotouhi and David A. Hodges; *IEEE J. Solid State Circuits*, vol. SC–14, pp. 920–926, Dec. 1979.

"Technological Design Considerations for Monolithic MOS Switched–Capacitor Filtering Systems", David J. Allstot and William C. Black, Jr., *Proc.IEEE*, vol. 71, pp. 967–968, Aug. 1983.

"Error Correction Techniques for High–Performance Differential A/D Converters", Khen–Sang Tan, Sami Kiriaki, Michiel De Wit, John W. Fattaruso, Ching–Yuh Tsay, W. Edward Matthews and Richard K. Hester; *IEEE J. Solid State Circuits*, vol. 25, No. 6, Dec., 1990.

"A 12–b 5–MSample/s Two–Steps CMOS A/D Converter", Behzad Razavi and Bruce A. Wooley,*IEEE J. Solid State Circuits*, vol. 27, No. 12, Dec. 1992.

"An IEEE 1451 Standard Transducer Interface Chip with 12–b ADC, Two 12–b DAC's, 10–kB Flash EEPROM, and 8–b Microcontroller", Tim Cummins, Eamonn Byrne, Dara Brannick and Dennis A. Dempsey, *IEEE J. Solid State Circuits*, vol. 33, No. 12, Dec. 1998.

* cited by examiner

Primary Examiner—Peguy Jeanpierre
(74) Attorney, Agent, or Firm—Howison, Thoma & Arnott, L.L.P.

(57) ABSTRACT

An digital-to-analog converter having main DAC resistor strings and sub-DAC resistor strings for converting MSB and LSB portions of a digital word into corresponding analog voltages. The main DAC resistor strings are driven by constant current sources to improve the linearity of the conversion process. The constant current sources present a high impedance to the main DAC resistor strings, thereby providing a more linear change in resistance during the conversion process, and reducing second-order harmonic nonlinearity.

24 Claims, 6 Drawing Sheets

DAC USING CURRENT SOURCE DRIVING MAIN RESISTOR STRING

CROSS-REFERENCE TO RELATED APPLICATIONS

This application is a Continuation-in-Part of U.S. patent application filed May 31, 2000, Ser. No. 09/584,217 entitled "D/A Resistor Strings with Cross Coupling Switches", the subject matter of which is incorporated herein by reference. This application is also related to U.S. Patent Application filed herewith, entitled "Dual Sub-DAC Resistor Strings With Analog Interpolation".

TECHNICAL FIELD OF THE INVENTION

This present invention relates in general to digital-to-analog converters, and more particularly to the segmented type of converter having multiple resistor strings for carrying out the conversion process.

BACKGROUND OF THE INVENTION

In mixed signal circuits which involve both analog and digital signals, circuits are generally required for converting the analog signals into corresponding digital signals, and vice versa. Digital-to-analog converters provide an analog output as a function of the digital input. Many different varieties of conversion circuits are commercially available to satisfy the various constraints required, such a speed, resolution, differential non-linearity, integral non-linearity, monotinicity, etc. The digital-to-analog conversion process can be carried out according to different techniques, including the use of weighted current sources, R-2 ladder networks, as well as many other well-known conversion schemes. Because of the wide utilization of microprocessors employed to process digital information, it is a common practice to integrate digital-to-analog converters on the microprocessor chip. Because the use of chip area is always a concern, the minimization of components is therefore of paramount importance.

In a rudimentary digital-to-analog converter having a 12-bit resolution, as many as 4,096 series resistors can be utilized to produce a different magnitude of analog voltage in response to each of the 4,096 digital words. The amount of semiconductor space required for all these resistors would be prohibitively large. In addition to each resistor, there are required corresponding switches across each resistor for selecting voltage levels in response to different input digital combinations.

Figure 1:
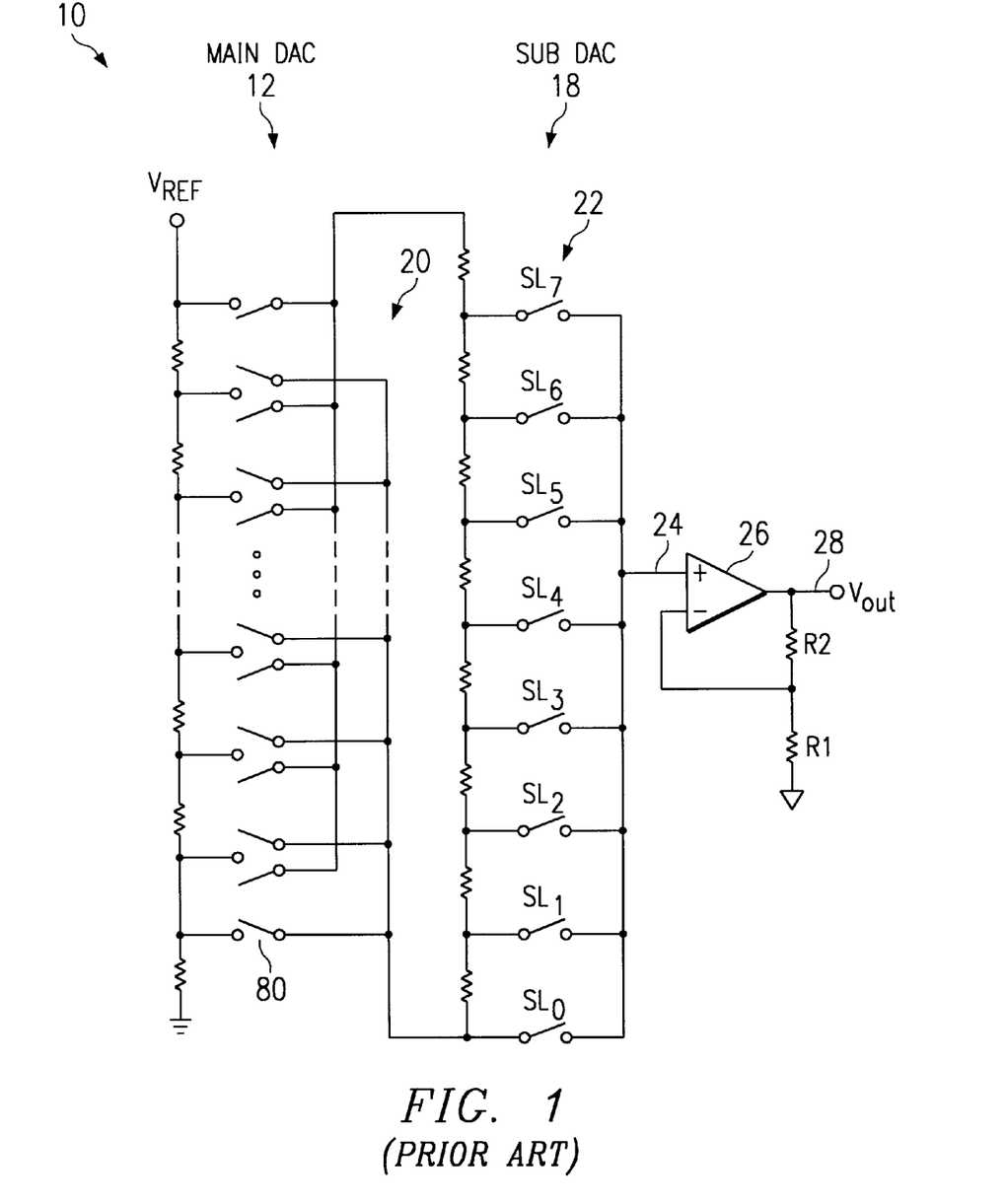
FIG. 1 is an electrical schematic diagram showing main and sub-DAC resistor strings arranged according to the prior art.

A segmented digital-to-analog converter (DAC) provides an adequate solution to the problem of a large number of resistors to carry out the conversion algorithm. FIG. 1 of the drawings illustrates two resistor segments or strings of a 12-bit DAC 10. The digital-to-analog converter 10 includes a main DAC 12 and a subsidiary ("sub") DAC 18. The main DAC 12 includes a number of series resistors to provide $2^x$ different analog levels in response to X most significant digital bits.

A sub-DAC resistor string 18 includes a number of series-connected resistors to provide $2^y$ different analog levels for the least significant bits of the DAC 10. The DAC 10 can accommodate X+Y digital input bits, and produces $2^{(x+y)}$ analog levels. A fewer number of resistors are required in a segmented DAC which is driven by a corresponding number of digital input bits.

A first switch multiplexer 20 is connected between the main DAC resistor string 12 and the sub-DAC resistor string 18. The switch multiplexer 20 is of conventional design for allowing the sub-DAC resistor string 18 to be connected in parallel to any one or more of the resistors in the main DAC resistor string 12. The switch multiplexer 20 is required to provide connections to $2^x$ different resistor combinations in the main DAC 12.

The sub-DAC 18 also includes a switch multiplexer 22 for selecting $2^y$ different resistance values. The output 24 of the second switch multiplexer 22 is connected to an operational amplifier 26. An output 28 of the amplifier 26 provides $2^{(x+y)}$ different analog outputs corresponding to the different combinations of the X+Y digital bits applied to the DAC 10.

While the switch connections between the main DAC resistor string 12 and the sub-DAC resistor string 18 provides a multiplying function and reduce the number of resistors required to complete the X+Y bit conversion, various shortcomings of this arrangement exist. For example, the coupling of the sub-DAC resistor string 18 to the main DAC resistor string 12 can present an unbalanced load thereon, as a function of the overall resistance of the sub-DAC resistor string 18. This can occur when the individual resistors of the string 18 are switched in or out of the circuit. When an unbalanced load is connected across the main DAC resistor string, a nonlinear conversion results. It is preferable to maintain a high degree of electrical isolation between the main DAC and sub-DAC resistor strings to prevent current flow therebetween and thus maintain balance. When current flows between the resistor strings, this gives rise to second order harmonic non-linearity. The loading of the main DAC resistor string by the sub-DAC resistor string can be reduced by making the resistance values of the sub-DAC resistors large. While this endeavor may reduce loading, more semiconductor area or space is required.

FIG. 1 illustrates main DAC resistor string 12 that is supplied with a reference supply voltage. The same loading problem exists when the sub-DAC resistor string 18 is independently powered by a reference supply voltage. Various attempts have been made in the prior art to overcome this loading problem between the main and sub-DAC resistor strings. As noted in the background portion of U.S. Pat. No. 4,338,591 by Tuthill, there is proposed the remedy of placing a buffer amplifier between the main DAC resistor string and the sub-DAC resistor string. The buffer amplifiers do effectively isolate the main and sub-DAC resistor strings. However, substantial semiconductor area is required to isolate the resistor strings with a pair of buffer amplifiers. Also, the dynamic range of the main DAC is severely limited by the input range and the finite common mode rejection of the buffer amplifiers.

Instead of isolating the main DAC and the sub-DAC resistor strings with buffer amplifiers, the use of a current source is suggested in U.S. Pat. No. 5,703,588 by Rivoir et al. By utilizing a constant current to drive the sub-DAC resistor string, a more balanced operation therebetween can be accomplished so that less current flows between the resistor strings. The main DAC resistor string remains driven by a reference voltage. The loading problem is thus reduced, irrespective of the switch connections. When utilizing a current source to drive the sub-DAC resistor string, it is imperative that the output impedance thereof is some orders of magnitude higher than the impedance of the resistor string being driven. Otherwise, inaccuracies in the conversion process become significant, especially when large voltage excursions in the sub-DAC are experienced.

Current mirrors are well known for use as current sources and current sinks in DAC resistor strings. While accurate current control can be achieved, the output impedance of such a structure is not always as high as desired. Utilizing two transistors in series as either a current source or a current sink in a DAC resistor string could increase the output impedance of the current source by a factor of the gain of the second transistor. This solution can cause other problems.

It can be seen from the DAC 10 shown in FIG. 1 that, depending on the switch setting of the switch multiplexers 20 and 22, analog voltages very near the reference voltage, or very near the circuit common voltage (ground) can be coupled to the output amplifier 26. Unless expensive, precision instrumentation amplifiers are utilized, a wide dynamic input range (rail-to-rail) of amplifiers is not always available. However, it is most desirable to design DAC resistor strings that operate "rail-to-rail", otherwise wasted voltage ranges due to headroom resistors must be used. In other words, to reduce the dynamic range over which the amplifier must operate, resistors can simply be placed in series at the top and/or bottom of the DAC resistor strings. Such resistors waste power and require additional semiconductor area.

The accuracy in the conversion of the digital input to an analog output is a function of the values of the resistors with which the resistor strings are formed in the semiconductor material. While exact value resistors are difficult to form in integrated circuits, the repeatability of making a nominal resistance value is relatively easy.

The value of the DAC resistors themselves is only one consideration in forming or scaling accurate resistance values for the resistor strings. Another consideration is the contact resistance for each semiconductor resistor. Since each resistor has two contacts, there may be a contact resistance in series with each semiconductor resistor. U.S. Pat. No. 5,343,199 illustrates DAC resistor strings where the various segments of a resistor string are connected together by metal contacts. When utilizing resistors of different values, the contact resistance presents a problem when attempting to scale the resistor values. For example, if the resistance for each contact is 10 ohm. Then the total resistance for a nominal 1k resistor would be 1,020 ohm. If it were desired to make one resistor that is exactly ten times the 1k value, then the total resistance of that resistor would be 10,020 ohm. The scaling of semiconductor resistors is thus difficult. In various DAC resistor strings, the values of resistors can be multiples of the others, and thus it is difficult to make the resistors with any degree of precision.

Even when the contacts are not directly in series with the individual resistor elements of the resistor string, the process variations in forming the contacts to the various resistor elements can adversely affect the values of the resistors. In those situations when the resistor string itself is one continuous resistor formed as a polysilicon strip or some other resistive material, or otherwise, the formation of a contact or tap overlying and in electrical contact with the polysilicon strip may affect the resistance of that part of the polysilicon underlying the contact.

It has been found that the repeatability of resistors having desired values is affected by the location of the resistors on the semiconductor material, as a function of what electrical components are formed adjacent to the resistors. Resistors formed adjacent other resistors tend to be more uniform in value than resistors formed near different components, such as transistors, capacitors, etc. Hence, it has been found that by forming dummy resistors on each lateral side of a number of active resistors, the active resistors are better matched in value. While the formation of dummy resistors adjacent the active resistors improves the resistor value matching, additional semiconductor area is required for nonactive resistor components.

The variation in resistor values as a result of semiconductor processing is realized by those skilled in the art, and as set forth in U.S. Pat. No. 5,343,199 by Sugawa. Each resistor string of the D/A converter is fabricated as two separate resistor strings, but with various nodes of one resistor string short circuited to the same voltage nodes of the other resistor string. Moreover, the voltage strings are cross-connected in a reverse manner so that the supply voltage of one end of one resistor string is the ground end of the companion resistor string. In this manner, with variations in resistance values due to process differences, the nodes are forced to the same voltage by the metal cross connects. Although additional metal cross connects are required, as well as the semiconductor area required to accommodate the metalization, the non-linear conversion error is reduced. However, when a voltage is extracted at a node of the resistor string that is not short circuited to a similar-voltage node of the companion resistor string, there can still exist a non-linear error due to the processing difference of resistors values.

In prior pending application filed May 31, 2000, Ser. No. 09/584,217, and entitled "D/A Resistor Strings with Cross Coupling Switches," there is disclosed a technique for switchably cross coupling the two sub-DAC resistor strings with semiconductor switches. This arrangement reduces the non-linearity errors caused by difference in resistances between the two sub-DAC resistor strings. In other words, similar voltage nodes of the resistor strings are short circuited together to provide an average of the two voltages. This interpolation of the sub-DAC resistor strings reduces the non-linearity caused by the inherent difference in resistance valves as a result of semiconductor processing variations.

It has been found that while the use of semiconductor switches provides a reduction in the non-linearity of the DAC, the varying resistances in the switches themselves is a cause of concern. The semiconductor switches constitute part N-channel transistors which, when driven into conduction to short circuit corresponding nodes of the sub-DAC resistor strings together, cause a voltage drop across the switch resistances. The switch resistance is primarily a result of the metalization contacts for interconnecting the transistor switches to the resistor string resistors. When the resistors are not perfectly matched between the resistor strings, different voltages exist between the corresponding nodes, and with a switch bridged between the nods, a current flows through the switch between the nodes. Although the voltage between the switch-connected nodes is interpolated, the switch resistance adversely affects the accuracy of the voltage at the switched node.

It can be seen that a need exists for a DAC that utilizes a pair of sub-DAC resistor strings where the voltages between nodes thereof are interpolated by the use of transistor switches, but where current does not flow through the closed switches, thereby reducing the effects of contact resistances that exist between the transistor switches and the resistor string nodes. Another need exists for a technique for providing interpolation of different analog voltages between corresponding nodes of a DAC resistor string, which facilitates signal settling times, thereby enhancing the speed of the DAC.

SUMMARY OF THE INVENTION

The present invention disclosed and claimed herein, in one aspect thereof, comprises a segmented DAC including dual main DAC resistor strings driven by respective current sources to reduce second order harmonic non-linearity.

The dual main DAC resistor strings are each driven by respective current sources. The current sources provide high impedance driver circuits for the resistor strings. With the main DAC resistor strings terminated at one end with a high impedance driver, the second order harmonic non-linearity is substantially eliminated because the impedance as viewed at any node of the resistor string is more uniform.

In the preferred embodiment, the constant current drivers constitute cascode-connected transistors to produce an even higher impedance to the resistor strings.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 2:
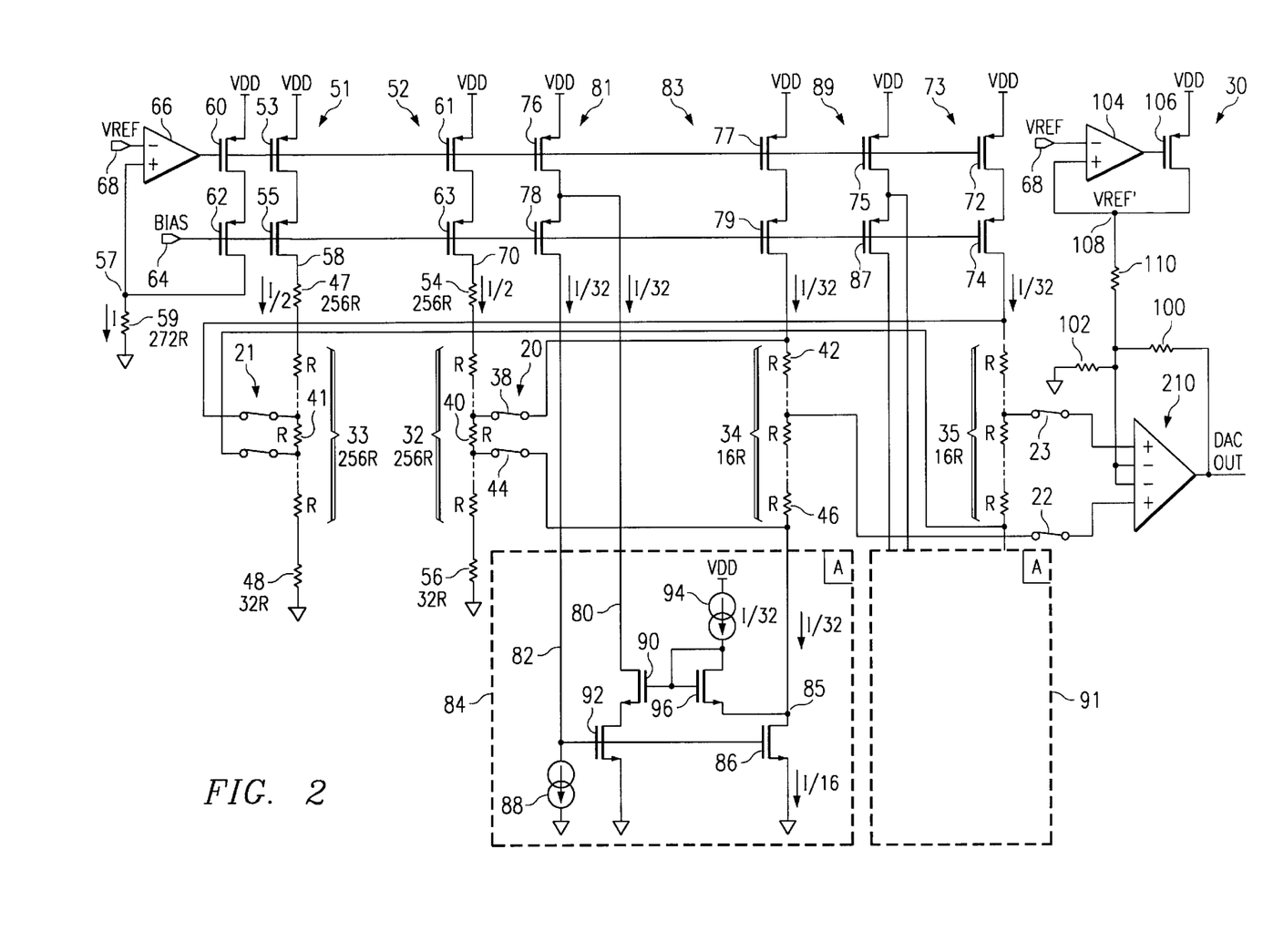
FIG. 2 illustrates the details of main and sub-DAC resistor string circuits and the respective driving circuits constructed according to the principles and concepts of a described embodiment of the invention.

FIG. 2 illustrates the details of the segmented DAC constructed according to a described embodiment. The DAC 30 incorporates a number of features, and overcomes the problems and disadvantages attendant with the prior art converters. The DAC 30 is shown with a first main resistor string 32 comprised of two hundred fifty-six resistors. The main resistor string 32 can produce two hundred fifty-six different analog voltage levels, corresponding to the different combinations of eight most significant digital bits. A sub-DAC resistor string 34 comprises sixteen resistors, each of equal value. The sub-resistor string 34 can produce sixteen different analog voltage levels, corresponding to four least significant digital input bits. A 12-bit D/A conversion is thus achieved. Each resistor of the main string 32 is fabricated with a nominal resistance value. Each resistor of the sub-resistor string 34 is also formed with the same nominal value resistance. In the preferred form of the invention, the nominal resistance value of each resistor is about 369 ohm.

A companion main DAC resistor string 33 is also comprised of two hundred fifty six resistors. The utilization of two main DAC resistor strings 32 and 33 reduces the effects of variations in resistor values when making the resistor strings in a semiconductor material. Associated with the second main DAC resistor string 33 is a second sub-DAC resistor string 35. The second sub-DAC resistor string is substantially identical to the first sub-DAC resistor string 34. The use of two sub-DAC resistor strings also reduces the effects of semiconductor process variations in making multiple semiconductor resistors of the same value.

A first main DAC switch multiplexer 20 is adapted for allowing the voltage across one or more resistors of the first main resistor string 32 to be coupled across the first sub-resistor string 34. The switch 38 of the first switch multiplexer 20 is effective to couple the voltage at the top node of resistor 40 of the main resistor string 32, to the top node of the resistor 42 of the first sub-resistor string 34. Switch 44 of the multiplexer 20 is effective to couple the voltage at the bottom node of main resistor string resistor 40, to the bottom node of the resistor 46 of the first sub-resistor string 34. The switch multiplexer 20 is essentially identical to that well known in the art, as shown in FIG. 3 of U.S. Pat. No. 5,703,588. As noted above, the plural switches of the multiplexer 20 are configured to provide switch connections to the various resistors to provide two hundred fifty-six different analog voltage levels across the conductors that couple the first main resistor string 32 to the first sub-resistor string 34.

A second switch multiplexer 21 is coupled to the second main DAC resistor string 33 to provide two hundred fifty-six different analog voltage levels corresponding to eight most significant bits of a digital word to be converted. The switches of the second multiplexer 21 place the selected analog voltage across the second sub-DAC resistor string 35. The two main DAC resistor strings 32 and 33 are fabricated in the layout shown in FIG. 5. The switch multiplexers 20 and 21 are arranged and controlled so as to couple substantially the same, or preferably identical analog voltages, from the main DAC resistor strings 32 and 33 to the corresponding sub-DAC resistor strings 34 and 35.

A sub-DAC switch multiplexer 22 is adapted for accessing voltages at the different resistor nodes of the first sub-resistor string 34. Sixteen different switches of the sub-DAC multiplexer 22 are adapted for selecting the analog voltage at sixteen different resistor nodes of the first sub-resistor string 34. The voltage is coupled via only one closed switch of the multiplexer 22 to a non-inverting input of an averaging amplifier 210. With two hundred fifty-six different analog voltages provided by the first main resistor string 32, and sixteen different analog voltages produced by the first sub-resistor string 34, four thousand ninety-six (4,096) different analog voltages can be provided to the averaging amplifier 210. This corresponds to twelve bits of digital resolution. Those skilled in the art can readily understand the circuitry involved to convert the input digital signals to corresponding switch operations of both the main and sub-switch multiplexers 20, 21, 22 and 23.

A second sub-DAC switch multiplexer 23 is effective to select one of sixteen analog voltages available at the respective nodes of the second sub-DAC resistor string 35. The sub-DAC switch multiplexers 22 and 23 are arranged and controlled to couple substantially similar analog voltages from the respective sub-DAC resistor strings 34 and 35 to the respective non-inverting inputs of the averaging amplifier 210. As will be described below, because of process variations involved in the fabrication of current sources and the resistor strings of the sub-DAC circuits, slightly different analog voltages are generated therein, but are averaged or interpolated to improve the linearity of the DAC.

As noted above, each resistor of the main resistor strings 32 and 33, as well as the sub-resistor strings 34 and 35, are constructed with substantially identical base-value resistances. Each resistor is made in appropriately doped semiconductor material to achieve a unit resistance of about 369 ohm. More accurate analog voltage levels are thus achieved. Although not shown, each DAC resistor includes two contacts, but such contacts are not formed either in series with the resistor segments, or thereover. Thus, each resistor can be made with substantially the same value. As such, a much better match between the overall resistance values of the main and sub-resistor strings is achieved.

Figure 3:
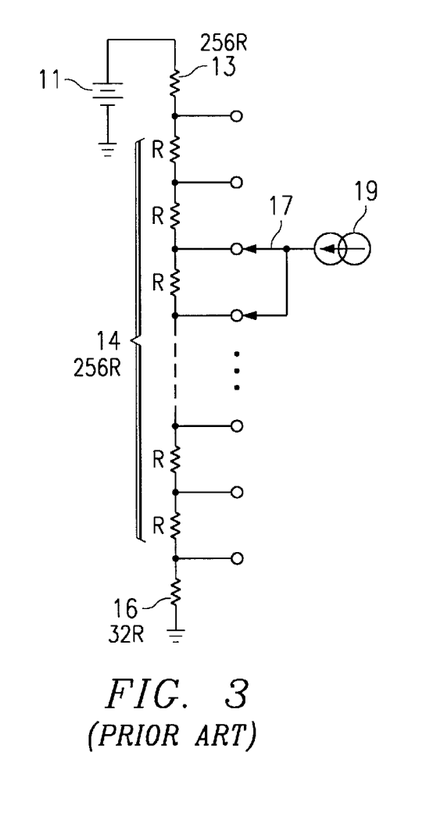
FIG. 3 is an electrical schematic diagram of a main DAC resistor string driven by a reference voltage, where an error current flows thereto from a sub-DAC resistor string.

The main DAC resistor strings of many conventional digital-to-analog converters are driven by reference voltages. Voltage references present a low impedance to the load that is driven. This arrangement results in an inherent non-linearity generated in the main DAC resistor string. An example of the non-linearity is shown in FIG. 3, where the resistor string circuit is similar to that described in pending U.S. patent application filed May 31, 2000, accorded Ser. No. 09/584,217, and entitled "D/A Resistor Strings With Cross Coupling Switches." The precision reference voltage is shown as a battery in FIG. 3 and is identified by reference numeral 11. The reference voltage 11 drives a headroom resistor 13 of value 256R, a primary resistor string 14 constituting 256 individual resistors, each of unit value R, and lastly an offset resistor 16 having a value of 32R. Each resistor of the primary resistor string 14 is selectable by a switch arrangement 17, similar to that shown in FIG. 1. When the primary resistor string 14 is configured in this manner, the bottom end thereof is either grounded directly, or through a resistor 16. The reference voltage 11 presents a low impedance to the resistor string 14, and thus is effectively grounded at the top terminal of the headroom resistor 13. Although each resistor of the primary resistor string 14 is of the same value, calculations show that when selecting such resistors by moving the switch arrangement 17 up or down the resistor string, the effective resistance as seen by the switch 17 is nonlinear.

In order to determine the nonlinear error inherent in the resistor string of FIG. 3, an example current source 19 is provided to generate an error current ($I_{error}$) for driving the primary resistor string 14 via the switch arrangement 17. The error current represents that current that may be carried between the primary resistor string and the secondary resistor string of a segmented DAC, due to inadequate isolation therebetween, mismatches in the current drivers of the resistor strings, etc. The equations set forth below illustrate the extent of the second harmonic non-linearity inherent in a primary resistor string driven by a reference voltage. It should be noted that $D_{in}$ represents the digital code of the DAC, which varies numerically from 1 to 256.

$$V_{error} = I_{error}[(32R + D_{in}R) // (256R + (256 - D_{in})R)]$$

$$= I_{error}[R(32 + D_{in}) // (512 - D_{in})]$$

$$= [I_{error}R(32 + D_{in})(512 - D_{in})] \div 544$$

$$= I_{error}R(30.1 + 0.88 D_{in} - 0.00184 D_{in}^2)$$

the second harmonic non-linearity =0.00184 $D_{in}^2$
If $I_{error}$ =0.155 μA
R =369Δ
LSB =0.61 mV
then $V_{error}$ $2^{nd}$ harmonic=6.9 mV or 11 LSB.

Figure 4:
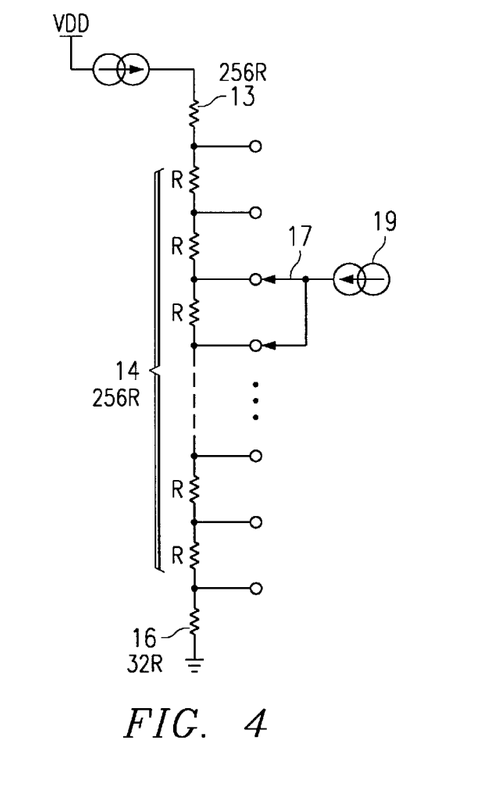
FIG. 4 is an electrical schematic diagram of a main DAC resistor string driven by a current source, where an error current flows thereto from a sub-DAC resistor string.

FIG. 4 is an exemplary main DAC resistor string configured identically to that shown in FIG. 3, but driven with a constant current source. As is well known, a constant current source presents a high impedance to the resistor string. When the resistor string is driven with a constant current source, the top terminal of the headroom resistor 13 is not effectively grounded. Rather, the top terminal of the headroom resistor 13 is effectively open circuited. With this circuit arrangement, as the switch multiplexer 17 moves up and down the main DAC resistor string 14, the resistance changes are linear, whereby the second harmonic non-linearity is significantly reduced.

The equations showing the much-reduced non-linearity are set forth below.

$$V_{error} = I_{error}(32R + D_{in}R)$$

$$= I_{error}R(32 + D_{in})$$

As noted, there is no second order term in the equation and thus the second order harmonic non-linearity is zero.

The main DAC resistor strings 32 and 33, as well as the sub-DAC resistor strings 34 and 35 of the present invention are driven by respective current sources. The current sources of FIG. 2 generate constant currents of predefined magnitudes based on a reference circuit comprising an operational amplifier 66, cascode transistors 60 and 62, and resistor 59.

Each main DAC resistor string 32 and 33 is driven by a respective precision current source. The sub-resistor strings 34 and 35 are also driven by respective current sources. As noted above, a high impedance current source is desirable in order to isolate changes in supply voltage and render the same independent of the analog output voltage obtained from the resistor strings. The output impedance, for example, of the sub-DAC resistor string current source transistor 72 is increased by a factor defined by the gain of cascode-connected transistor 74. The increased impedance feature applies also to the other cascode-connected current sources.

As noted above, the main DAC utilizes mirror-image resistor strings 32 and 33. In order to reduce second order harmonic non-linearity, each main DAC resistor string 32 and 33 is driven by a respective constant current source. The current source 52 for the first main DAC resistor string 32 comprises cascode-connected transistors 61 and 63. The constant current source 51 for the second main DAC resistor string 33 comprises cascode-connected transistors 53 and 55. The current sources 51 and 52 are identically constructed and driven by the same signals, thereby driving substantially identical currents of I/2 in the respective main resistor strings 32 and 33. By utilizing current mirrors, the sub-DAC resistor strings 34 and 35 are also each driven by constant currents of magnitude I/32.

The first main resistor string 32 draws current through a pair of series-connected transistors 61 and 63. These transistors mirror the current in the first main resistor string 32 in a desired ratio to the sub-resistor strings 34 and 35. The manner in which the cascode transistors in the main DAC resistor strings and the cascode transistors in the sub-DAC resistor strings are interconnected, assures that the current that drives the main resistor strings 32 and 33 is replicated in a specified ratio in the sub-resistor strings 34 and 35.

A current I/2 is driven by the current source 52 through a headroom resistor 54, through the main resistor string 32, and finally through an offset resistor 56. The headroom resistor 54 is not part of the first main resistor string 32 in terms of producing an analog voltage level for D/A conversion, but functions to provide a headroom voltage for the current sources of the sub-resistor strings. In the preferred form of the invention, the headroom resistor 54 is of the same value as the composite resistance of the first main resistor string 32. The offset resistor 56 is preferably a smaller value resistor than the headroom resistor 54. In one aspect of the invention, the offset resistor 56 is one-eighth (⅛) the value of the headroom resistor 54. The function of the offset resistor will be described in more detail below.

The current source 51 drives a current of I/2 through the resistors of the second main DAC resistor string. The current of I/2 is driven through a headroom resistor 47, two hundred fifty-six resistors of the second main resistor string 33 and lastly, through an offset resistor 48. These resistors are substantially identical in value to those associated with the first main DAC resistor string 32.

A bias voltage 64 supplies a voltage to the gate of transistor 62. An operational amplifier 66 drives the gate of transistor 60 with a voltage. The inverting input of the operational amplifier 66 is connected to a reference voltage 68. The non-inverting input of the amplifier 66 is connected to the junction 57 between a resistor 59 and the source terminal of transistor 62. With this arrangement, the junction 57 is maintained at the reference voltage Vref. In like manner, the precision voltage Vref is maintained at the junction 70 of the first main resistor string 32 and the junction 58 of the second main resistor string 33. The channel width of the current source transistors 55 and 63 are each half the channel width of transistor 62. In like manner, the channel width of each transistor 53 and 61 is one half the width of transistor 60. Accordingly, the current that passes through each current source transistor 55 and 63 is one-half that that passes through transistor 62.

The valve of resistor 59 in the voltage reference circuit is one-half the total resistance of each of the main DAC resistor strings 32 and 33, including the headroom resistors and the offset resistors. The total series resistance in the first main DAC resistor string is 544R. The value of voltage reference resistor 59 is 272R, namely one-half that of the composite resistances of each main DAC resistor string. Thus, the voltage at node 57 as generated by the reference voltage is substantially the same as that at nodes 58 and 70 which are driven by the current sources 51 and 52. The current I/2 which drives the main DAC resistor string 32 is thus a function of the magnitude of the reference voltage at node 70. As can be appreciated, the current of the current sources 51 and 52 may change because of temperature considerations, the switched resistor connections to the sub-resistor strings, reference voltage variations, changes in parameters of the main resistor string, etc. What is important is that because of the mirroring of the current from the main DAC resistor strings 32 and 33 to the sub-resistor strings 34 and 35, any change in the former is reflected in the latter. The maintenance of this current relationship reduces any loading effect that the sub-resistor strings 34 and 35 would otherwise have on the main DAC resistor strings 32 and 33.

The first sub-resistor string 34 is driven by a mirrored current source 83. The sub-resistor string current source 83 constitutes a series-connected transistor arrangement to thereby increase the output impedance thereof. Series-connected transistors 77 and 79 provide a very high output impedance to the first sub-resistor string 34. The headroom resistor 54 in the first main DAC resistor string 32 allows the current source transistors 71 and 79 to operate in an acceptable voltage range to supply a mirrored current to the first sub-resistor string 34. Although the dynamic range of operation of the main resistor strings 32 and 33 and the sub-resistor strings 34 and 35 are limited because of the headroom resistors 54 and 47, such limited dynamic range is overcome in a manner set forth below.

Since the headroom resistor 54 is the same value as the composite resistance of the first main resistor string 32, the headroom resistor 54 serves an additional important role in maintaining the resistance matching accuracy of the first main DAC resistor string 32. Because of the variations in semiconductor manufacturing process, dummy resistors are often placed around the active resistor to compensate for the street effect in order to maintain electrically good resistor matching properties. However, dummy resistors are otherwise nonfunctional and require additional silicon area and thus increase the manufacturing cost. As will be described more fully below, the resistor 54 functions as both the headroom resistor and the street effect compensation resistor. Therefore, no silicon area is unnecessarily wasted on dummy resistors alone.

Forming a part of the mirrored current source associated with the first sub-resistor string 34 is an additional pair of series-connected transistors, namely transistor 76 and transistor 78. Much like current supply transistors 53 and 61 which drive the respective first and second main resistor strings 32 and 33, the transistors 72, 75, 76 and 77 associated with the sub-resistor strings 34 and 35 are driven by the output of the operational amplifier 66. In like manner, transistors 74, 78, 79 and 87 associated with the sub-resistor strings 34 and 35 are driven by the bias voltage 64. The conduction channel width of current source transistors 72 and 74 and current source transistors 77 and 79 are constructed to provide respective mirrored currents of I/32 to the sub-resistor strings 34 and 35, as compared to main resistor string current supply transistors 53 and 58 and current supply transistors 61 and 63 which supply respective currents of I/2. The reason for this current difference by a factor of sixteen is that the composite resistance value of each sub-resistor string 34 or 35 is sixteen times the resistance value of one selected main resistor string resistor, such as resistor 40 or 41. By maintaining this current ratio between the main and sub-resistor strings, the current flow therebetween is reduced, as is the loading therebetween. As noted above, each resistor of the first and second main resistor strings 32 and 33 is of the same value, and can be individually selected by respective switches of the switch multiplexers 20 and 21. Current source transistor 76 is structured to provide a current of I/16, one half of which is carried on conductor 80, and one half of which is carried through transistor 78 on conductor 82. Transistor 78 and conductor 82 thus carry together a current of I/32.

A first regulated current sink 84 functions to provide a high output impedance to the current sink, while using only a single current sink transistor 86 in series with the first sub-resistor string 34. The current carried through series transistor 86 is regulated as a function of an amplifier defined by transistors 76 and 78, as well as current sources 88 and 94, and transistors 90, 92 and 96. The output of the amplifier is connected to the gates of transistors 92 or 86. The current flowing through transistor 92 and the output of the amplifier define a negative feedback loop which forces the current carried by transistor 92 to be equal to the difference between the current source 88 and the current of transistor 76. The current that flows through transistor 92 is mirrored in transistor 86 by a ratio of 1:2. Hence, a current of magnitude I/32 flows through transistor 92, thereby causing a current of magnitude I/16 to flow through current sink transistor 86. The amplifier and feedback arrangement associated with current sink transistor 86 substantially increase the output impedance thereof, without requiring a substantial voltage swing for operation thereof.

The voltage developed across the offset resistor 56 connected at the bottom of the first main resistor string 32 provides the operating voltage range for the current sink transistor 86. As noted above, the current sink transistor 86 is regulated to maintain a constant current of I/16 therethrough. As also noted above, transistors 92 and 86 form a current mirror such that series current sink transistor 86 maintains twice the current therethrough, as compared to transistor 92. The current source 88 maintains a bias on the gate of transistor 92 such that the current I/32 is maintained through transistor 92.

In the amplifier feedback circuit, the current source 94 creates a constant current of I/32 that is carried through transistor 96. The current I/32 carried by transistor 96, as well as the current I/32 carried through the first sub-resistor string 34, are combined and carried through the current sink transistor 86 as current I/16. The transistors 96 and 90 force the voltage on node 85 equal to the voltage on the drain of transistor 92. Thus, current sink transistor 86 has the exact replica bias condition as transistor 92. Once the current through the transistor 92 is established via the negative feedback, the current is mirrored to the current sink transistor 86. As noted above, the conduction channel of transistor 86 is twice that of transistor 92, whereby transistor 86 carries twice the current, i.e., I16. The current sources 94 and 88, the transistors 90,96 and 76 not only maintain a constant current through current sink transistor 86, but also multiply the output impedance thereto. The output impedance of current sink transistor 86 is multiplied by a factor of about 100, due to the negative feedback amplifier arrangement. By utilizing only a single current sink transistor 86, in conjunction with the feedback amplifier, the operational voltage thereacross is much smaller than the cascode-connected current sources connected at the top portion of the first main resistor string 34. With this arrangement, the current sink transistor 86 can operate with as little as 0.1 volt of drain-source voltage. As noted above, the voltage across the offset resistor 56 determines the range of operating voltage across the current sink transistor 86.

The second sub-resistor string 35 includes current source transistors 75 and 87 for driving a current sink circuit 91 coupled to the bottom of the resistor string. The current sink circuit 91 is substantially identical in construction and operation to the current sink circuit 84 described above.

From the foregoing, the two main resistor strings 32 and 33 and the two sub-resistor strings 34 and 35 of the D/A converter are driven by mirrored currents to maintain an isolation between the resistor strings so that improved conversion accuracy is achieved. In addition, high impedance output current sources and sinks are provided in the sub-resistor strings 34 and 35 to provide a high degree of isolation at the respective top and bottom thereof, as well as to improve the current regulation therethrough. In accordance with another important feature, linearity is improved substantially by driving the main DAC resistor strings 32 and 33 with respective high output impedance current sources.

As noted above, the resistor 54 located in the main resistor string 32 provides operational headroom for the cascode-connected current sources, as well as device matching properties. Because the value of the headroom resistor 54 is the same as the composite resistance of the main resistor string 32, the dynamic range of the analog voltages generated in the conversion circuit is about half the reference supply voltage. Although the offset resistor 56 further reduces the dynamic range, its value is one-sixteenth (¹⁄₁₆) that of the combined resistance of the headroom resistor 54 and the main resistor string 32. In practice, the dynamic range of the analog voltage generated in the main DAC is about 0.4706 times the reference voltage Vref. A wide operating voltage range is reestablished in the configuration of the output amplifier.

The output analog voltage resulting from the digital conversion in the two sub-resistor strings 34 and 35 is carried by way of the switch multiplexers 22 and 23 to the non-inverting inputs of the averaging amplifier 210. The feedback resistor 100 and the input resistor 102 of the averaging amplifier 210 are of the same resistance value. The value of resistor 110 is eight times the resistance value of either resistor 102 or 100. By configuring the averaging amplifier 210 as a non-inverting amplifier with the feedback resistor, the gain thereof becomes 2.125. Hence, because the dynamic range of the analog voltages generated by the resistor strings 32 and 33 and 34 and 35 is about 0.4706 times the reference supply voltage, the averaging amplifier 210 increases the amplitude of the analog signals by a factor of 2.125, thereby reestablishing the full dynamic range of the converted analog voltage. An output voltage swing of the averaging amplifier 210 from rail to rail is thus reestablished. The rail-to-rail voltage according to the preferred form of the invention is from ground to the reference voltage Vref.

Configured much like operational amplifier 66 in the reference voltage circuit, the amplifier 104 drives transistor 106 so that a reference voltage of Vref is maintained at node 108. The reference voltage biases the resistor 110 connected to the non-inverting inputs of the averaging amplifier 210. As noted above, the value of resistor 110 is eight times that of either resistor 100 or 102. The value of resistor 110 with regard to resistor 100 shifts the operating point of the averaging amplifier 210, thereby overcoming the effect of the offset voltage generated by offset resistors 56 and 48.

From the foregoing, a high precision integrated digital-to-analog converter has been disclosed. The resistor elements of both the main resistor strings and the sub-resistor strings are of identical nominal values, thereby improving the accuracy of the analog voltage levels generated by the resistor strings. The main DAC resistor strings are driven by respective precision current source circuits. By utilizing high impedance output current sources and replicating the current from the main DAC resistor string, a highly accurate sub-DAC output is achieved. From a matching perspective, the headroom resistor improves the accuracy of the main DAC resistor string by also functioning effectively as street compensation components.

Figure 5:
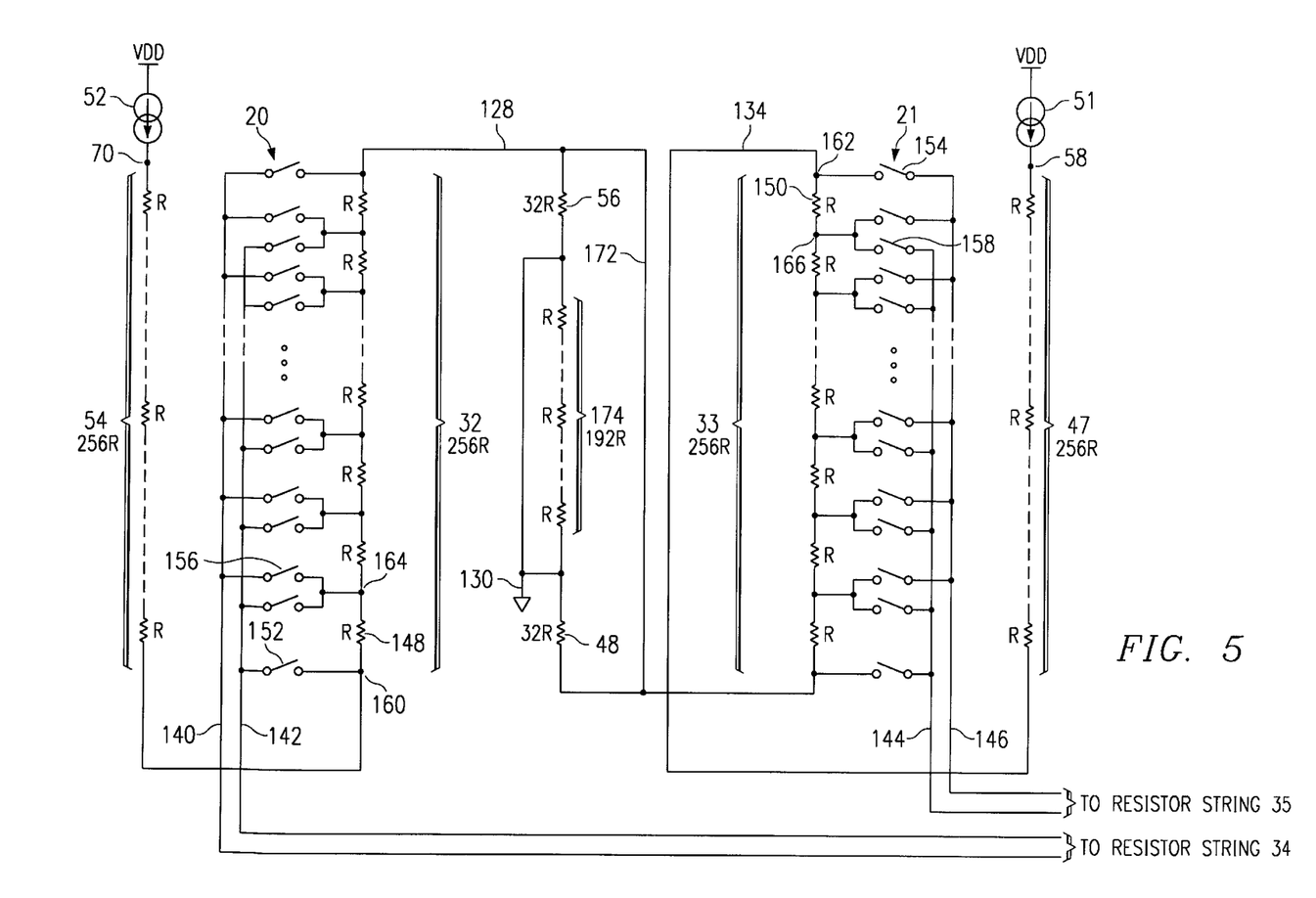
FIG. 5 illustrates a general layout of the main DAC resistor string, and its companion resistor string, with the switch multiplexers for selecting analog voltages from the resistor strings and coupling the same to the respective sub-DAC resistor strings.

FIG. 5 illustrates the main DAC resistor strings 32 and 33. In practice, the main DAC resistor strings 32 and 33 are connected to the respective sub-DAC resistor strings by the switch multiplexers described above. In practice, the main DAC resistor strings 32 and 33 of FIG. 2 are laid out and fabricated as the resistor strings shown in FIG. 5. The headroom resistors 54 and 47 of FIG. 2 are also fabricated as two resistors. It can be seen that the headroom resistor 54 is in a series with the first main DAC resistor string 34. In like manner, the headroom resistor 47 is in series with the companion main DAC resistor string 33. Each of the main DAC resistor strings 32 and 33 is fabricated with 256 individual resistors of identical value. Each headroom resistor 54 and 47 is similarly fabricated with 256 identical-valve resistors. The top end of each headroom resistor 54 and 47 is connected to a respective current source 52 and 51. Node 70 is driven by the current source 52 defined by transistors 61 and 63 to provide a high impedance output to the first main DAC resistor string 32. Node 58 is driven by the current source 51 defined by transistors 53 and 55 to provide a high impedance output to the second main DAC resistor string 33. The offset resistors 48 and 56 of FIG. 2 are also laid out and fabricated as corresponding resistors in series with the respective sub-DAC resistor strings 32 and 33.

Rather than cross connecting the nodes of the main DAC resistor strings 32 and 33 that are of similar voltages with transmission gate type switches, the selected resistors of each main DAC resistor string are placed in parallel across the respective sub-DAC resistor strings 34 and 35 by way of switch multiplexers 20 and 21. The transistor switches function to provide a decoding function for selecting a resistor of each main DAC resistor string 32 and 33 for coupling the voltage thereof to the respective sub-resistor string 34 and 35.

A first switch multiplexer 20 includes a number of transistor switches that are connected across each resistor of the first main DAC resistor string 32. This is illustrated in a more simplified form in FIG. 6. A second switch multiplexer 21 includes a similar number of transistor switches connected across each resistor of the second main DAC companion resistor string 33. Various switches of the first switch multiplexer 20 are connected to a first conductor 140 which is coupled to the bottom end of the first sub-resistor string 34. Other switches of the first multiplexer 20 are connected to another conductor 142 that is coupled to the top end of the first sub-resistor string 32. The second switch multiplexer 21 is similarly connected to select individual resistors of the main DAC companion resistor string 33. Some of the switches of the second multiplexer 21 are connected to a third conductor 144, and the remainder of the switches of the second switch multiplexer 21 are connected to a fourth common conductor 146. The conductor 144 of the second switch multiplexer 21 is connected to the bottom end of the second sub-DAC resistor string 35. In like manner, the conductor 146 of the second switch multiplexer 21 is connected to the top end of the second sub-DAC resistor string 35.

The switches of the first multiplexer 20 and the second multiplexer 21 are operated by a decoder (not shown) in such a manner that the switches operate together so that resistor 148 (for example) of the first main resistor string 32 is selected together at the same time with resistor 150 of the companion main resistor string 33. In other words, the decoder functions to close transistor switch 152 together with transistor switch 154, as well as close transistor switch 156 together with transistor switch 158. By operation of these switches, the first main DAC resistor 148 is connected across the first sub-DAC resistor string 34. Main DAC resistor 150 is similarly connected across the second sub-DAC resistor string 35.

With this arrangement, each and every resistor or group of resistors of the main DAC resistor strings 32 and 33 can be coupled across the respective sub-resistor strings 34 and 35.

Figure 6:
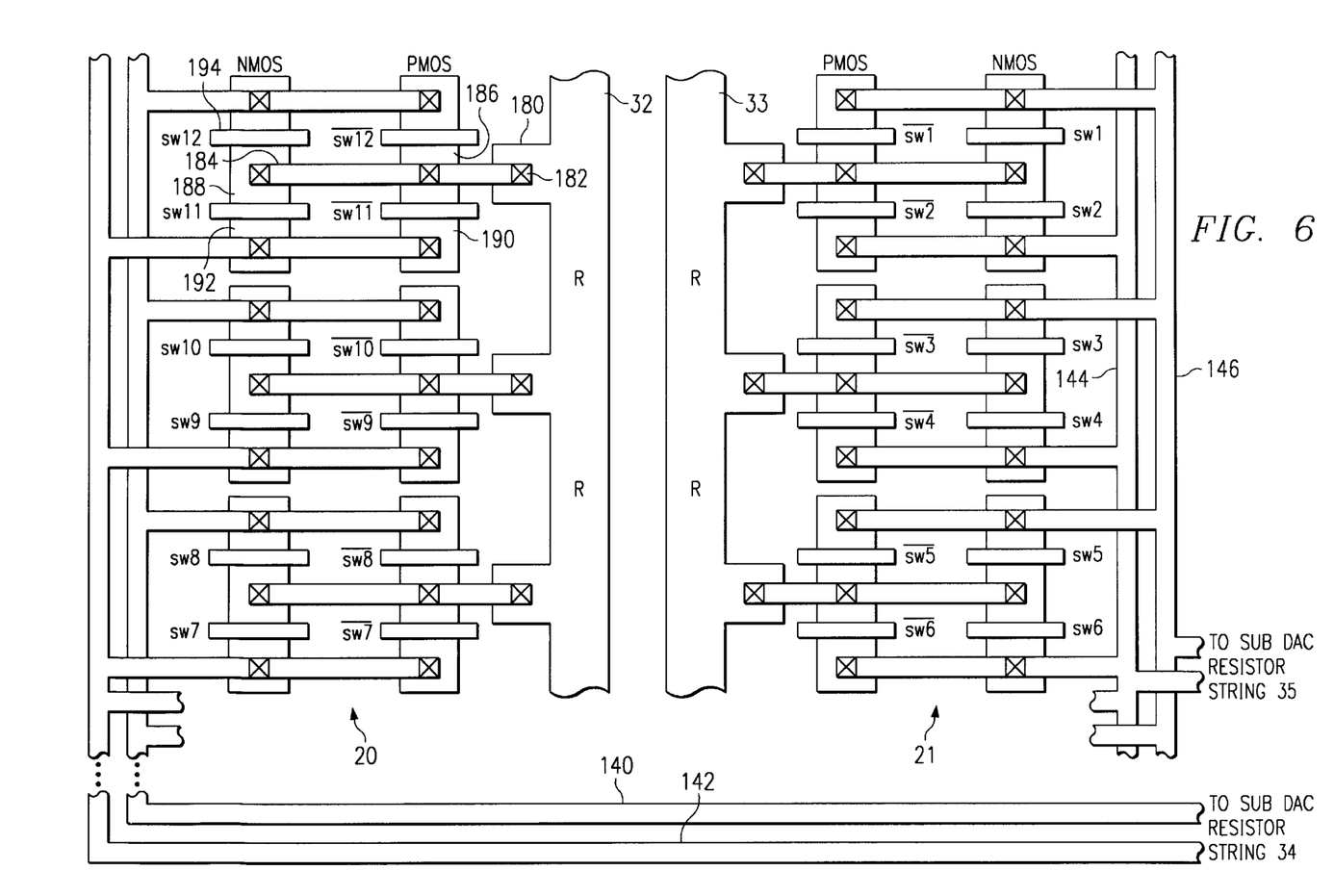
FIG. 6 illustrates a physical layout of the transmission gate switches as connected to the resistors of the main DAC resistor string.

FIG. 6 illustrates a layout showing the manner in which the main DAC resistor strings 32 and 33 are connected to the respective sub-DAC resistor strings 34 and 35 by way of the first switch multiplexer 20 and the second switch multiplexer 21. Only a portion of the resistor strings 32 and 33 and the corresponding switch multiplexers are shown. For purposes of clarity, the other functional and dummy resistors of the main DAC resistor strings are not shown. As can be seen, the resistor string 32 is a continuous strip of polycrystalline silicon of a desired resistivity. In practice, the elongate resistor 32 is masked so as to be serpentine-shaped, as is customary. Importantly, the polysilicon resistor strip 32 includes a number of lateral arms 180 for forming a contact 182 thereto. The contact 182 is not formed over or in the main resistor strip 32. Thus, current flowing through the main resistor strip 32 is not affected by any irregularity in the resistance that may be caused by the contact 182. As described below, no current flows through the contact 182 when the associated switches are closed.

The contact 182 is connected to a conductor 184 that is connected to a PMOS transistor 186 and an NMOS transistor 188. The transistors 186 and 188 define a first set of transistors comprising a transmission gate for selectively coupling the junction 180 of the resistor strip 32 to the common conductor 140. The second set of transistors comprising a PMOS transistor 190 and an NMOS 192 constitute a second transmission gate for coupling the junction 180 of the resistor strip 32 to the other common conductor 142. The gate terminals of the four transistors, one shown as reference numeral 194, are coupled to the decoding circuits (not shown) that control which resistor of the main DAC resistor string 32 is to be selected and the voltage thereacross coupled to the first sub-resistor string 34. The gates of the PMOS transistors and the NMOS transistors are driven by complementary signals. Each of the other arms or junctions of the resistor string 32 is switched to a similar pair of transmission gates to the respective common conductors 140 and 142. The second switch multiplexer 21 includes similar pairs of transmission gates for coupling the junctions of the companion resistor string 33 to the common conductors 144 and 146. The common conductors 144 and 146 of the second switch multiplexer 21 re coupled to the second sub-DAC resistor string 35.

Figure 7:
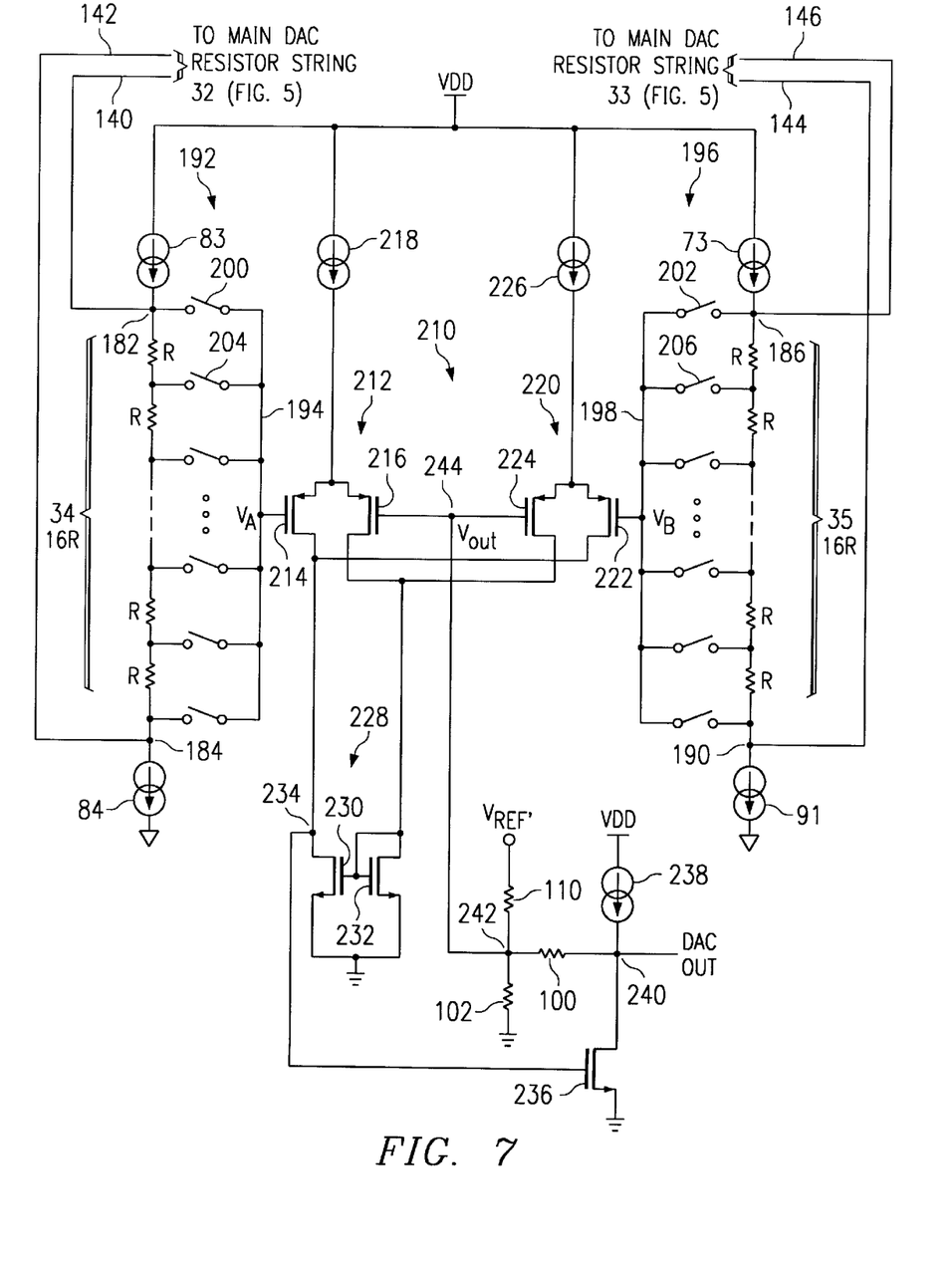
FIG. 7 illustrates the dual resistor strings of the sub-DAC, with the differential input circuits providing analog voltage interpolation between the sub-DAC resistor strings.

FIG. 7 illustrates the switch multiplexer connections between the main DAC resistor strings 32 and 33 and the sub-DAC resistor strings 34 and 35. Moreover, there is illustrated the sub-DAC switch multiplexers adapted for selecting resistor voltages from each sub-DAC resistor string 34 and 35 and applying the analog voltages to an averaging or interpolation circuit. According to an important feature of the invention, there is also shown the utilization of a differential input circuit for interpolating the analog voltages between the nodes of the dual sub-DAC resistor strings 34 and 35.

The decoding of the least significant bits of the digital word provides control signals for controlling the selection of analog voltages in the sub-DAC circuits. A first switch multiplexer 192 includes a plurality of switches, each coupled to a node between resistors of the first sub-DAC resistor string 34. One pole of each switch is connected to a node, and the other pole of each switch is connected in common to a conductor 194. By selectively closing one switch by appropriate decoding circuits, the voltage at the associated node can be coupled to the conductor 194. Each resistor of the first sub-DAC resistor string 34 is of unit value R, and such resistor string includes sixteen resistors. Sixteen different voltages, including a zero voltage, can be obtained from the first sub-DAC resistor string 34. By utilizing sixteen resistors, four least significant bits can be decoded and converted to sixteen different analog voltages. The second sub-DAC resistor string 35 is similarly constructed, with sixteen semiconductor resistors, and a second switch multiplexor 196 connected thereto at the various resistor string nodes. Each resistor node can be coupled by way of a respective switch to a common conductor 198.

Much like the switch construction of the switches 20 and 21 in connection with the main DAC resistor strings, the switches 192 and 196 are constructed during the fabrication of the DAC as conventional PMOS and NMOS transmission gates. One switch of multiplexer 192 is operated in unison with one switch of the second multiplexer 196. In other words, when switch 200 of the first multiplexor 192 is operated so as to close, switch 202 of the second multiplexor 196 is also closed. When switch 204 of the first multiplexer 192 is operated, switch 206 of the second multiplexer 198 is also operated, and so on. As noted above, only one switch of each multiplexer 192 and 196 is operated at a time so that only a single analog voltage from the respective resistor strings 34 and 35 is selected. Ideally, the selected analog voltages from the sub-DAC resistor strings 34 and 35 produce identical voltages. However, due to semiconductor processing variations, each resistor is not of identical value, and the constant currents through the resistor strings 34 and 35 may also be non-equal. The linearity of the DAC is improved by interpolating the analog voltages tapped from each sub-DAC resistor string 34 and 35 to find the average voltage. Rather than connecting the nodes of the resistor strings 34 and 35 together by switches to produce an interpolation of the analog voltages at the respective nodes, an averaging or interpolation circuit 210 is utilized.

The common conductor 194 of the first switch multiplexer 192 is coupled to a high impedance input of the averaging circuit 210, as is the common conductor 198 of the second switch multiplexer 196. The high input impedance of the averaging circuit 210 substantially eliminates any current flow through the switch multiplexers 192 and 196, thereby reducing the effects of contact resistance inherent in the switches, or the resistance resulting from the switch connections to the semiconductor resistor strings. As such, a higher degree of accuracy is achieved in the digital-to-analog conversion process.

The averaging circuit 210 includes a first differential input circuit 212 comprising a first P-channel transistor 214 and a second P-channel transistor 216 connected to provide differential inputs. The transistor pair 214 and 216 are driven by a constant current source 218. The gate terminal of transistor 214 is connected to the common conductor 194 of the first switch multiplexer 192. It is well known that the input impedance of such type of transistor is very high, well into the megohm range. As such, very little, if any, current flows through the switches of the first multiplexer 192. Nevertheless, the analog voltage at the selected node of the resistor string 34 is coupled to the gate terminal of the differential input transistor 214.

The common conductor 198 of the second switch multiplexer 196 is coupled to a differential input circuit 220 constructed similar to that identified by reference numeral 212. The second differential input circuit 220 includes P-channel transistors 222 and 224 driven in a differential manner by a constant current source 226. The high impedance input of FET transistor 222 is coupled to the common conductor 198 of the second switch multiplexer 196. The gate terminal of transistor 224 of the second differential input circuit 220 is connected to the gate terminal of transistor 216 of the first differential input circuit 212. Connected to both differential input circuits 212 and 220 is a current mirror circuit 228 including transistors 230 and 232. The drain terminals of differential input circuit transistors 214 and 222 are connected to the drain terminal of current mirror transistor 230. In like manner, the drain terminals of differential input circuit transistors 216 and 224 are connected to the drain terminal of current mirror transistor 232. The current mirror circuit 228 is configured to draw equal currents on its two inputs from the differential circuits 212 and 220.

The output of the differential input circuits 212 and 220 is at node 234 of the current mirror circuit 228. The output 234 is connected to the gate of an output N-channel transistor 236. A current source 238 drives the output transistor 236, as well as a feedback circuit. The output of the DAC, which is the analog voltage converted from the corresponding input digital signals, is taken at node 240. At node 240, the current source 238 drives the output transistor 236, as well as feedback resistor 100. The feedback resistor 100 provides a feedback of the averaging circuit 210, back to the differential inputs of transistors 216 and 224, the gate terminals of which are tied together. Node 242 is equivalent to the inverting inputs of the averaging circuit 210. Resistor 102 is coupled from the inverting inputs 242 to ground, and together with the feedback resistor 100, determines the gain of the circuit. Based on the values of the resistors 100 and 102, the gain of the averaging circuit 210 is about 2.125. The connection of the amplifier 104 of FIG. 2, transistor 106 and the reference voltage 68 applied to the inverting input of the amplifier 104, provides a reference voltage (Vref) to node 108. Node 108 is connected to the non-inverting inputs 242 of the averaging amplifier 210 by way of resistor 110.

In operation, the interpolation of the analog voltages generated by the first sub-DAC resistor string 34 and the second sub-DAC resistor string 35 is accomplished by the averaging circuit 210 in the following manner. It is assumed, for example, that the analog voltage switched to the switch multiplexer common conductor 194 is 1.1 volt, and the voltage switched to the other switch common conductor 198 is 0.9 volts. In practice, the voltage difference between the two sub-DAC resistor string nodes may be in the range of a few millivolts. The differential input circuits 212 and 220 will then readjust the current sharing (of the current sources 218 and 226) between the transistor pair 214 and 216, as well as between 224 and 222 to thereby drive the current mirror circuit 228 such that the output 234 drives the output transistor 236.

The differential input circuits 212 and 220 are configured so that based on any differential voltages applied thereto, transistor 214 will draw the same magnitude of current from current source 218, as transistor 224 will draw from current source 226. In like manner, transistor 216 will draw the same magnitude of current from source 218, as transistor 222 will draw from source 226. Since the current sources 218 and 226 provide the same magnitude of constant current to the differential input circuits 212 and 220, such circuits function to provide differential currents to the two inputs of the current mirror circuit 228, as a function of the differential voltage applied from the resistor strings 34 and 35 to the differential input pairs 212 and 220 of the averaging amplifier 210.

The feedback resistor 100 is coupled to the node 244 defining the common differential inputs of the differential input circuits 212 and 220. In a short time, the averaging amplifier 210 readjusts such that the voltage fed back to the node 244 produces the least error or difference, as compared to the voltage on both of the switch multiplexer common conductor 194 and 198. In the example, the averaging circuit 210 settles out such that the voltage at node 244 is 1.0 volts, exactly intermediate the differential input voltages of 1.1 volts and 0.9 volts. A corresponding output voltage will be produced at node 240 of the DAC, depending upon the gain of the averaging amplifier 210.

From the foregoing, it can be seen that the averaging circuit 210 effectively includes two differential input pairs. One input of one differential paid receives one analog input voltage from one resistor string, and the other analog voltage from the other resistor string is applied to the other input of the other differential pair. The remaining differential inputs are coupled together and connected to a feedback voltage, which effectively defines the average of the two input voltages. The provision of the averaging circuit 210 provides at least two distinct advantages. First, because the averaging amplifier includes high impedance inputs, substantially no current flows through the switch multiplexers. This reduces any effect of contact resistance in the switches. In addition, by reducing the current flow in the switches, less time is required to charge the various parasitic capacitances associated with switches and the resistors, whereby corresponding electrical transients settle out and become negligible in a much shorter period of time. Hence, the overall conversion time is reduced.

While the invention is embodied in a DAC, the concepts can be utilized in many other types of resistor circuits. Also, the averaging circuit can be configured to find an intermediate voltage that is not the average of the two voltages being compared. If the two resistor strings are constructed with different resistances, then the intermediate voltage generated by the averaging circuit may be scaled appropriately. When the various features are utilized in conjunction with resistor strings of segmented type DACs, those skilled in the art may prefer to dispense with the headroom resistors an/or the offset resistors. Many other applications of the invention to those skilled in the art will be apparent. Moreover, it may be advantageous to utilize only a few of the advantages of the invention without incorporation all of the various features and advantages.

Although the preferred embodiment has been described in detail, it should be understood that various changes, substitutions and alterations can be made therein without departing from the spirit and scope of the invention, as defined by the appended claims.

What is claimed is:

1. A digital-to-analog converter, comprising:
    a first resistor string for generating a plurality of analog voltages;
    a second resistor string for generating a plurality of analog voltages;
    a selection circuit responsive to one or more most significant bits of a digital word for selecting an analog voltage from said first resistor string, and for coupling the selected analog voltage to said second resistor string; and
    a high impedance driver for driving said first resistor string, thereby providing improved linearity in the digital-to-analog conversion.

2. The digital-to-analog converter of claim 1, wherein said high impedance driver comprises a constant current source.

3. The digital-to-analog converter of claim 1, further including a switch multiplexer defined by said selection circuit, for selecting a voltage across one or more resistors of said first resistor string, and whereby when said switches sequentially select a voltage across each said resistor, a change in impedance as seen by said switch multiplexer is linear.

4. The digital-to-analog converter of claim 2, wherein said constant current source comprises a pair of cascode-coupled transistors to thereby provide a high impedance to said first resistor string.

5. The digital-to-analog converter of claim 4, wherein an impedance of said cascode-coupled transistors is in the range of about 10 megohm to about 500 megohm.

6. The digital-to-analog converter of claim 5, wherein one transistor of said cascode-coupled transistors is driven by a bias voltage.

7. The digital-to-analog converter of claim 6, wherein a second transistor of said cascode-coupled transistors is driven by an operational amplifier.

8. The digital-to-analog converter of claim 1, wherein said first resistor string defines a first main DAC resistor string, and further including a second main DAC resistor string, and further including a constant current source for individually driving each said first and second main DAC resistor strings.

9. The digital-to-analog converter of claim 8, wherein a bottom end of said first and second main DAC resistor strings are connected to a low impedance.

10. The digital-to-analog converter of claim 9, wherein said low impedance comprises a ground potential.

11. The digital-to-analog converter of claim 1, further including an offset resistor connected to said first resistor string for providing a voltage offset function to circuits connected to said second resistor string.

12. The digital-to-analog converter of claim 11, further including a head room resistor connected to said first resistor string for providing an operational headroom voltage function for circuits connected to said second resistor string.

13. The digital-to-analog converter of claim 8, wherein said selection circuit couples a voltage from said first resistor string in parallel across all resistors of said second resistor string.

14. The digital-to-analog converter of claim 1, further including a constant current source for driving said first resistor string, and a constant current source for driving said second resistor string.

15. The digital-to-analog converter of claim 14, further including a circuit for mirroring the current in a specified ratio from said first resistor string to said second resistor string.

16. The digital-to-analog converter of claim 15, wherein said ratio is a function of the ratio of the resistance of said first resistor string to the resistance of said second resistor string.

17. A method of providing digital-to-analog conversion, comprising the steps of:
    driving a first resistor string having a plurality of nodes to produce a corresponding plurality of different voltages;
    driving said first resistor string with a high impedance source to thereby reduce non-linearity errors;
    coupling one of said plurality of different voltages from said first resistor string to a second resistor string;
    selecting one said voltage of said plurality of different voltages for coupling to said second resistor string, as a function of bits of a digital word; and
    providing an analog output voltage from said second resistor string.

18. The method of claim 17, further including driving said first resistor string with a constant current source.

19. The method of claim 18, further including driving a constant current through said first resistor string to a ground potential.

20. The method of claim 17, further including driving said first resistor string with a constant current source comprised of a first transistor connected in series with a second transistor to thereby provide an increased impedance.

21. A digital-to-analog converter, comprising:
    a first main DAC resistor string;
    a second main DAC resistor string;
    respective constant current sources driving said first and second main DAC resistor strings;
    a first sub-DAC resistor string;
    a second sub-DAC resistor string;

respective constant current sources driving said first and second sub-DAC resistor strings;

a constant current driven in each said sub-DAC resistor string being a predefined ratio of current driven in each said main DAC resistor string, said current ratio being a function of a ratio of resistance of a main DAC resistor string to a sub-DAC resistor string;

a first switch multiplexer for selecting a voltage from each said main DAC resistor strings as a function of bits of a digital word, and coupling the selected voltages to said sub-DAC resistor strings; and a second switch multiplexer for selecting a voltage from said sub-DAC resistor strings as a function of other bits of the digital word.

22. The digital-to-analog converter of claim 21, wherein each said constant current source comprises cascode-connected transistors.

23. The digital-to-analog converter of claim 21, wherein respective constant currents are driven through said main DAC resistor strings to ground.

24. The digital-to-analog converter of claim 21, further including a constant current sink connected to each said sub-DAC resistor string, whereby a constant current is applied to each said sub-DAC resistor string at one respective end thereof, and said constant current is sunk at an opposite end thereof by said constant current sinks.

* * * * *